(12) United States Patent
Brist et al.

(10) Patent No.: US 6,882,762 B2
(45) Date of Patent: Apr. 19, 2005

(54) WAVEGUIDE IN A PRINTED CIRCUIT BOARD AND METHOD OF FORMING THE SAME

(75) Inventors: Gary A. Brist, Yamhill, OR (US);
Carlos Mejia, Portland, OR (US);
William O. Alger, Portland, OR (US);
Gary B. Long, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 09/963,637

(22) Filed: Sep. 27, 2001

(65) Prior Publication Data

US 2003/0059151 A1 Mar. 27, 2003

(51) Int. Cl.[7] ................................................. G02B 6/12
(52) U.S. Cl. .......................................... 385/14; 385/129
(58) Field of Search ............................ 385/14, 129–132

(56) References Cited

U.S. PATENT DOCUMENTS

| | | | |
|---|---|---|---|
| 3,150,336 A | 9/1964 | Gonda | |
| 3,157,847 A | 11/1964 | Williams | |
| 5,381,596 A | 1/1995 | Ferro | |
| 5,562,838 A | * 10/1996 | Wojnarowski et al. | ........ 216/24 |
| 5,779,134 A | 7/1998 | Watson et al. | |
| 5,929,728 A | 7/1999 | Barnett et al. | |
| 6,000,120 A | 12/1999 | Arledge et al. | |
| 6,043,861 A | 3/2000 | Davis | |
| 6,185,354 B1 | 2/2001 | Kronz et al. | |
| 6,387,284 B2 | * 5/2002 | Hornbeck et al. | ............ 216/24 |
| 6,539,157 B2 | * 3/2003 | Doi | ............................ 385/129 |
| 2003/0035613 A1 | * 2/2003 | Huber et al. | .................. 385/16 |

FOREIGN PATENT DOCUMENTS

GB    2 340 959 A    3/2000

OTHER PUBLICATIONS

Collins et al., "Technique for micro–machining millimetre–wave rectangular waveguide," *Electronics Letters*, 34;10, pp. 996 and 997, IEE, May 14, 1998.

* cited by examiner

*Primary Examiner*—Rodney Bovernick
*Assistant Examiner*—Sung Pak
(74) *Attorney, Agent, or Firm*—John F. Travis

(57) ABSTRACT

A method is provided for forming a waveguide in a printed circuit board. This may include forming a trench in a printed circuit board substrate and forming at least one metalized surface along the trench. A metalized capping surface may be provided over the trench so as to form the waveguide structure.

29 Claims, 6 Drawing Sheets

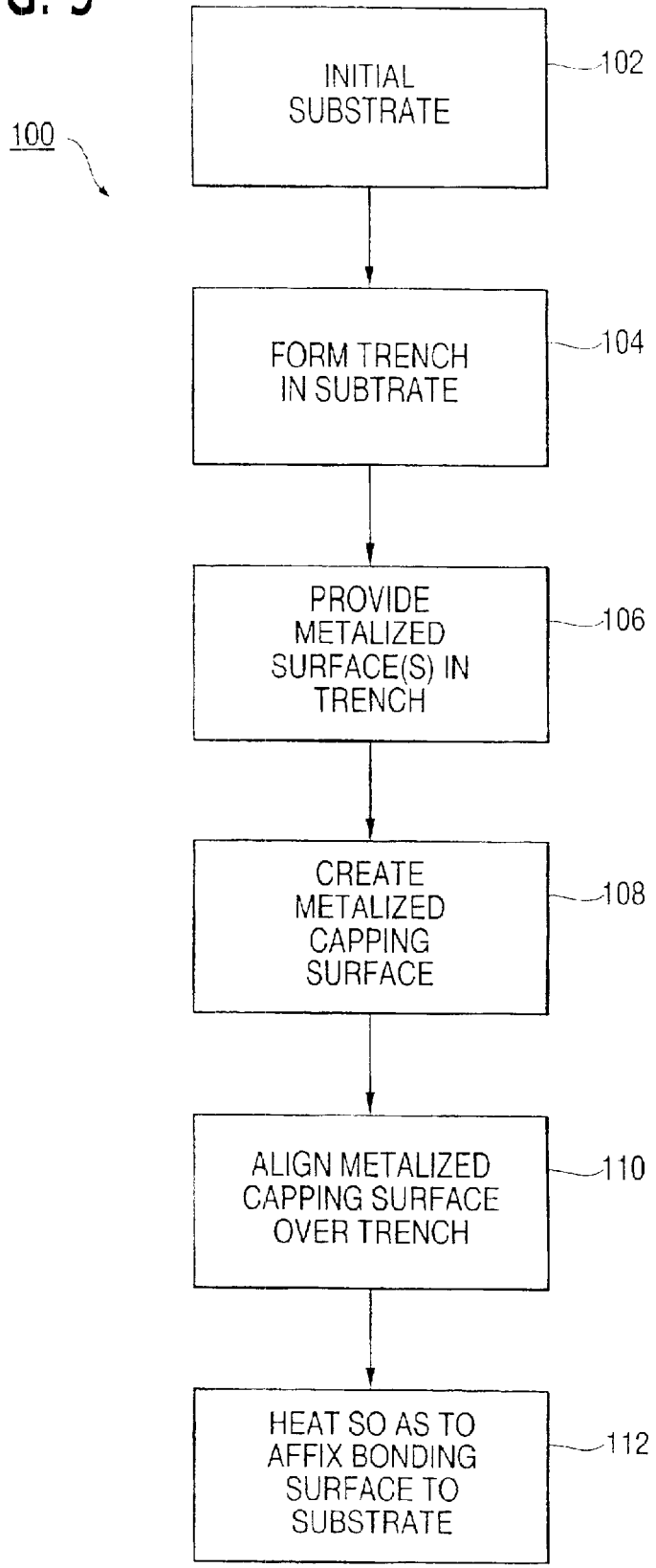

WAVEGUIDE IN A PRINTED CIRCUIT BOARD AND METHOD OF FORMING THE SAME

FIELD

The present invention is directed to the field of printed circuit boards. More particularly, the present invention is directed to a waveguide for optical (and/or RF) transmission in a printed circuit board (or integrated circuit package).

BACKGROUND

A printed circuit board (PCB) is a composite of organic and inorganic materials with external and internal wiring that allows electronic components to be mechanically supported and electrically connected. A PCB may contain multiple insulation layers sandwiched between metal layers. A typical PCB contains at least one metal layer that is patterned to transfer signals between the electronic components, one power plane for distributing voltage throughout the PCB, and one ground plane.

Shielded transmission lines may be used to ensure that high-speed signals and radio frequency (RF) signals are transmitted without interference or corruption by other signals, and to ensure that these signals do not emanate unwanted electronic emissions. One way of insulating or protecting these signals is to use shielded cable that includes a central conductor within a plastic dielectric material surrounded by a braided conductor. Although this construction is extremely effective in transmitting signals over a distance, it may require cumbersome interconnects, and may not be useful for transmitting signals over small distances such as on a printed circuit board, for example. Numerous methods have been employed to create a shielded signal path on printed circuit boards. One option is to sandwich the signal conductor in the interior of the PCB between two outer ground planes. Unfortunately, this construction may only protect the signal conductor on the top and bottom sides but not the two lateral sides. In addition, this option may require considerable real estate on the PCB surfaces and significantly increase the laminate thickness.

Optical waveguides are another way to transmit signals. A waveguide transmits light or electromagnetic energy through an empty cavity or through a filled channel (as in glass or plastic fiber of a fiber optic cable). The waveguide may be coated with a highly reflective coating that causes the signal to be totally reflected from one side of the guide to the other. Waveguides may be used for communicating signals at all frequencies of the electromagnetic spectrum such as at radio frequencies and radar frequencies in addition to optical frequencies. It is desirable to form a waveguide within a printed circuit board so as to avoid problems caused by other transmission means and to enjoy the benefits of optical transmission.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIG. 9 is a flowchart showing operations of a method according to an example embodiment of the present invention.

DETAILED DESCRIPTION

Figure 1:
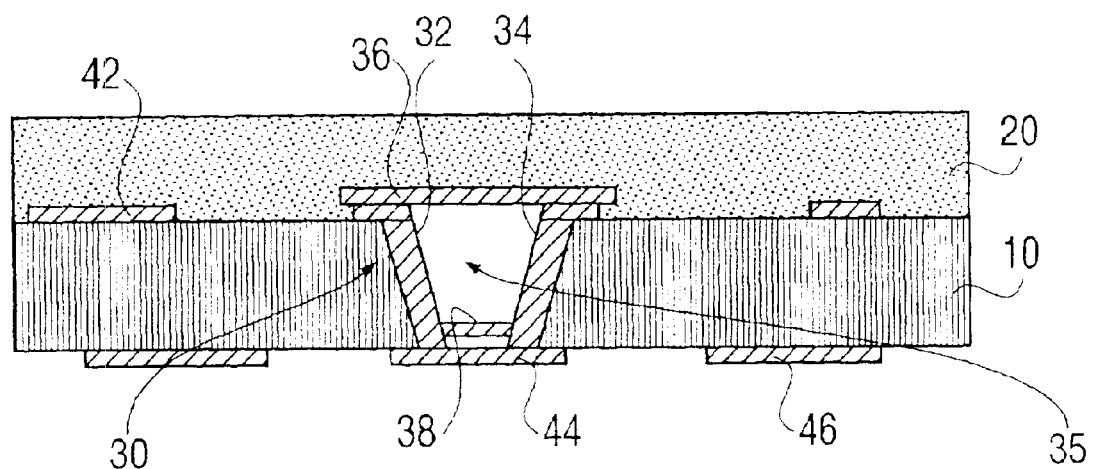
FIG. 1 shows a waveguide in a printed circuit board according to an example embodiment of the present invention.

In the following detailed description, like reference numerals and characters may be used to designate identical, corresponding or similar components in differing figure drawings. Further, in the detailed description to follow, example embodiments may be described, although the present invention is not limited to the same. Where specific details are set forth in order to describe example embodiments of the invention, it should be apparent to one skilled in the art that the invention can be practiced without, or with variation of, these specific details.

Embodiments of the present invention may be described with respect to substrates having a top surface and a bottom surface. One skilled in the art would understand that any reference to a top surface and a bottom surface are merely exemplary of the figure drawing based on the orientation of the page. That is, a top surface in the figure drawings may not correspond to a top surface in actual use. It is intended that the terminology top and bottom are merely for reference with respect to the figure drawings.

Embodiments of the present invention may provide a waveguide (or waveguide structure) in a printed circuit board or integrated circuit package. This may involve forming metalized trenches/channels in printed circuit board (PCB) laminate materials or within cured multi-layer PCBs. Embodiments of the present invention may also place/form a waveguide surface (i.e., a top wall of the waveguide) on bonding/adhesive material prior to laminating/bonding. The placement of the waveguide surface on the bonding material may be done by tack bonding, such as tack bonding a metal feature/strip to a b-stage side of a sheet of resin coded copper (RCC) foil, for example. The tack bonding process may be utilized to join b-stage epoxy to other materials as one method to ensure alignment between circuit board layers. The placement of the waveguide surface on the bonding material may also be done by etching a copper foil previously adhered to a b-stage/c-stage composite.

Accordingly, embodiments of the present invention may provide a method of forming a waveguide structure in a printed circuit board. This may include forming a trench in a substrate (such as a printed circuit board or a layer of a printed circuit board), providing at least one metalized surface along the trench, and applying a bonding surface having a metalized capping surface to the substrate such that the metalized capping surface is located over the trench having the at least one metalized surface so as to form the waveguide structure.

More specifically, the trench or channel may be formed in a dielectric material. That is, a channel/trench may be formed by selectively removing or displacing the dielectric material with any one of a number of well-known techniques such as by laser, photo-development, plasma or mechanical methods. The channel or trench may be formed along the path of the intended waveguide. The channel/trench may then be metalized to provide conductive walls of the intended waveguide.

Subsequently, a metalized capping surface may be created on a bonding material. This capping surface may be formed by selectively removing a metal layer from the bonding material, or selectively adding/placing metal/conductive surfaces onto the bonding material.

The dielectric material (having the metalized channel) and the bonding material (having the metalized capping surface) may be bonded together to form the intended waveguide. This may be achieved by placing the metalized bonding material and the metalized channel together such that the waveguide surfaces align to form the intended waveguide structure. The waveguide structure may be completed by processing the aligned components through the required bonding cycle for the bonding material.

More specifically, FIG. 1 illustrates a waveguide structure provided within portions of a printed circuit board according to an example embodiment of the present invention. Other embodiments and configurations are also within the scope of the present invention. More particularly, FIG. 1 illustrates a first substrate 10 having a second substrate 20 mounted thereon. A waveguide (or waveguide structure) 30 is provided within the first substrate 10. In this embodiment, the waveguide 30 includes sidewalls 32 and 34, a top wall 36 and a bottom wall 38. The walls 32, 34, 36 and 38 may be reflective surfaces so as to enable the guiding of signals through the waveguide 30. The surfaces may also be electrically conductive. The waveguide 30 also includes an interior area 35 that may be filled with any material (such as resin) that is dissimilar to the material used in the forming of the walls 32, 34, 36 and 38 or the interior area 35 may contain air (i.e., an unfilled interior area). FIG. 1 additionally shows metal or conductive traces 42, 44, 46 located on the top and bottom surfaces of the substrate 10. Other metal traces are not labeled. Still further, the walls 32 and 34 may extend only partially through the material 10 and the wall 38 may be physically separated from the surface of the trace 44.

A method of forming the waveguide 30 in the printed circuit board will now be described with respect to FIGS. 2–8. That is, FIGS. 2–8 represent various operations in the formation of the waveguide 30 according to an example embodiment of the present invention. Other operations and embodiments are also within the scope of the present invention.

Figure 2:
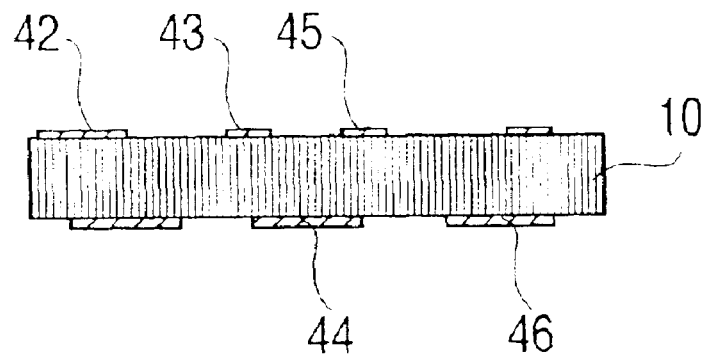
FIG. 2 illustrates a substrate having conductive traces.

FIG. 2 illustrates the first substrate 10 that may have the metal traces 42, 44, 46 (labeled in FIG. 1) and metal traces 43 and 45 (not labeled in FIG. 1) formed thereon. The substrate 10 may be a layered printed circuit board, for example. That is, the substrate 10 may correspond to a PCB laminated core.

Figure 3:
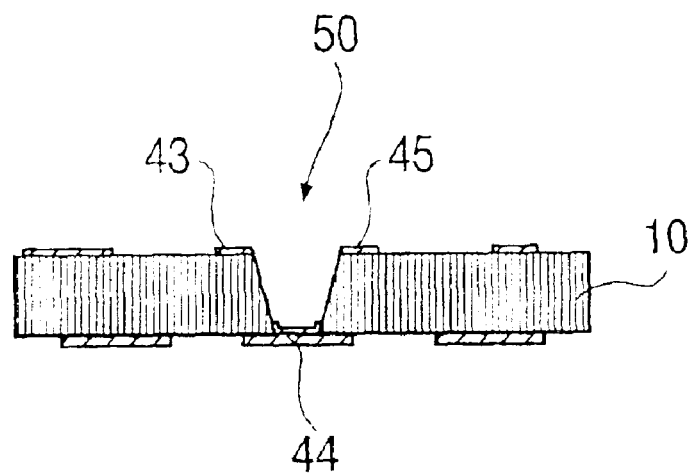
FIG. 3 illustrates a trench formed in the substrate of FIG. 2.

FIG. 3 illustrates a trench 50 (or channel) formed within the substrate 10. The trench 50 may be formed by any of a number of well-known manners such as mechanically (i.e., routing, drilling or stamping), chemically (i.e., dry or wet etch) or electro-mechanically (i.e., laser or plasma). As shown in FIG. 3, the metal traces 43 and 45 may be formed on a top surface of the substrate 10 at a location adjacent the top opening of the trench 50. As will be described below, the metal traces 43 and 45 may support a wall or surface of the waveguide 30.

Figure 4:
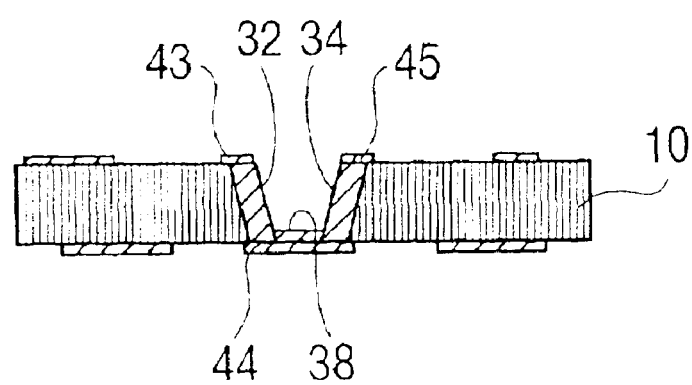
FIG. 4 illustrates metalized surfaces in the trench of FIG. 3.

FIG. 4 illustrates metalization of three surfaces (or walls) within the trench 50. That is, FIG. 4 illustrates the metalized sidewall 32, the metalized sidewall 34, and the metalized bottom wall 38. The metalization of the wall(s) may be done in any of a number of well known manners including electroless, electrolytic and sputtering. One skilled in the art would recognize that while FIG. 4 illustrates three walls of the trench 50, these walls may actually only correspond to one surface of the waveguide 30 or they may correspond to a plurality of surfaces of the waveguide 30. That is, surfaces of the trench 50 may be metalized to form three walls (shown in FIG. 4), or may be metalized to form one metalized wall or any number of walls. That is, one or a plurality of walls or surfaces may form the waveguide. These embodiments are all within the scope of the present invention.

Figure 5A:
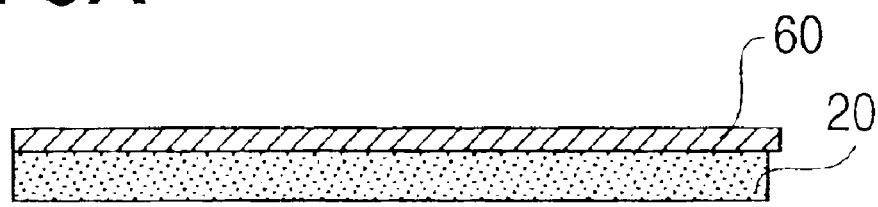
FIG. 5A illustrates a bonding substrate having a metalized surface formed thereon.
Figure 5B:
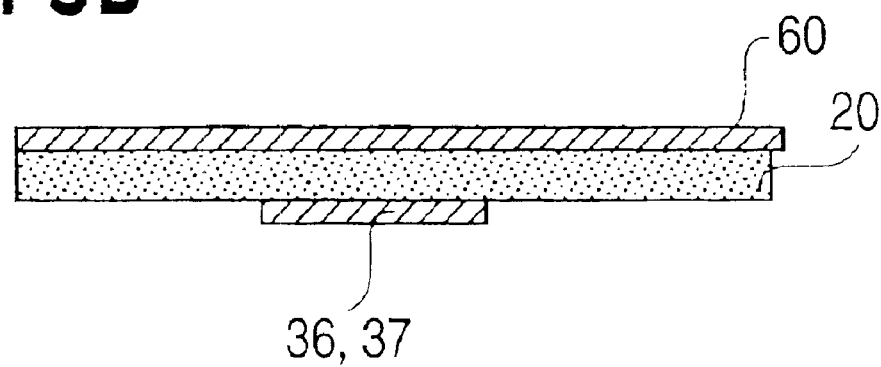
FIG. 5B illustrates the FIG. 5A structure having a metalized capping surface formed thereon.
Figure 6A:
FIG. 6A illustrates a bonding substrate.
Figure 6B:
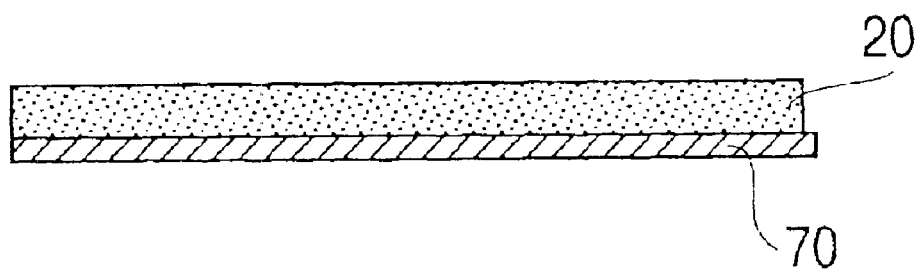
FIG. 6B illustrates a metalized surface on the FIG. 6A substrate.
Figure 6C:
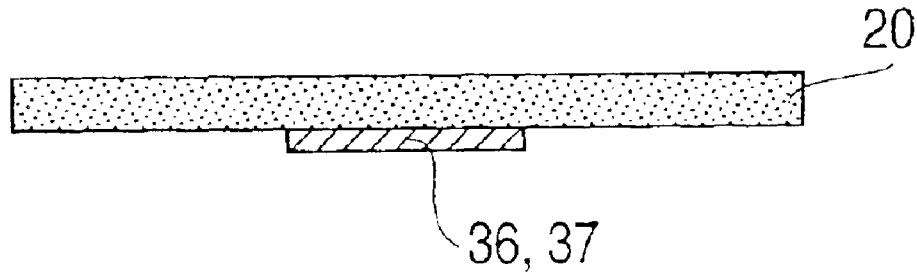
FIG. 6C illustrates a metalized capping surface formed from the FIG. 6B structure.

The operations shown in FIGS. 5A–5B show the formation of a metalized capping surface that may be placed on a top of the trench 50 (shown in FIG. 4) to form the top wall 36 of the waveguide 30. The operations shown in FIGS. 6A–6C show another formation of the metalized capping surface that may be placed on a top of the trench 50 (shown in FIG. 4) to form the top wall 36 of the waveguide 30. The operations shown in FIGS. 5A–5B and/or the operations shown in FIGS. 6A–6C are all within the scope of the present invention. Other operations for forming the metalized capping surface are also within the scope of the present invention.

FIG. 5A shows the formation of a waveguide surface (i.e., the top wall 36) on bonding material. This may involve providing the substrate 20, which may be a bonding material such as adhesive, epoxy, FEP, RCC or B-stage epoxy. A metal substrate (or surfaces) 60 may be placed on one surface (here the top surface) of the substrate 20. FIG. 5B shows the formation of a metalized surface 37 (corresponding to the top wall 36 of the waveguide 30). The metalized surface 37 is a metalized capping surface that may be aligned on the top of the trench 50 when the waveguide 30 is complete. The metalized surface 37 may be placed on the bonding material (i.e., the substrate 20) by tack bonding, plating or by any other well-known method. The substrate 20, the substrate 60 and the metalized surface 37 may be placed onto the waveguide structure of FIG. 4 as will be described below.

FIGS. 6A–6C illustrate other operations for forming the metalized capping surface on bonding material. For example, FIG. 6A shows the bonding material such as adhesive, epoxy, FEP, RCC or B-stage epoxy. FIG. 6B shows a metal coating 70 that may be applied to one surface (here the bottom surface) of the substrate 20. The metal coating 70 may be applied by plating or tacking to the substrate 20. FIG. 6C shows the formation of the metalized surface 37 (corresponding to the top wall 36 of the waveguide). The metalized surface 37 is the metalized capping surface that will be aligned on the top of the trench 50 when the waveguide 30 is complete. More specifically, FIG. 6C shows that portions of the metal coating 70 have been selectively removed so that only the metalized surface 37 remains.

Figure 7:
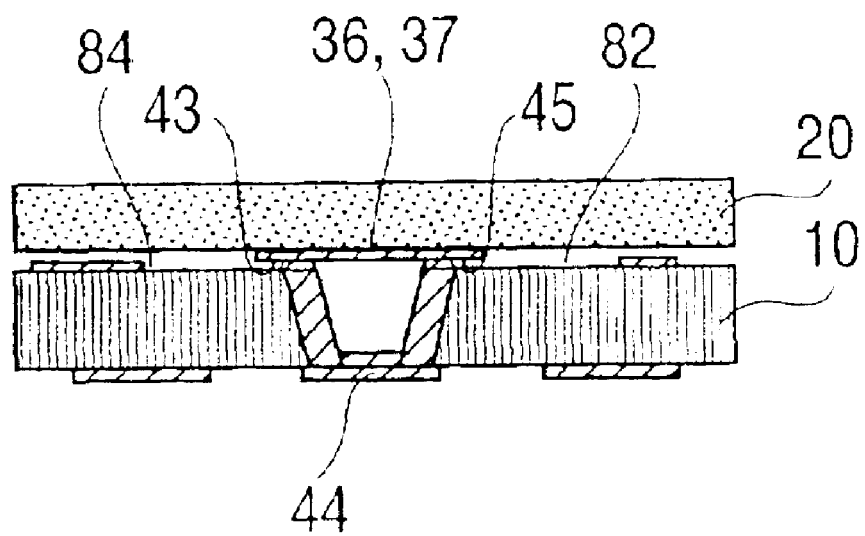
FIG. 7 illustrates a metalized capping surface and bonding substrate on the FIG. 4 structure.

FIG. 7 illustrates the metalized surface 37 aligned with the metalized trench formed in the substrate 10. The metalized surface 37 forms the top wall 36 of the waveguide 30 by the placement and alignment of the substrate 20 over the substrate 10. As may be seen, the top wall 36 covers over the metal trace 43 and the metal trace 45 that are provided on the top of the substrate 10 just adjacent to the opening of the trench 50. Prior to aligning the substrate 20 and the metalized surface 37 over the substrate 10, the interior area 35 of the waveguide structure may be filled with resin, if desired. FIG. 7 further shows open areas 82 and 84 that may exist between the substrate 10 and the substrate 20 prior to any reflow of the bonding material.

Figure 8:
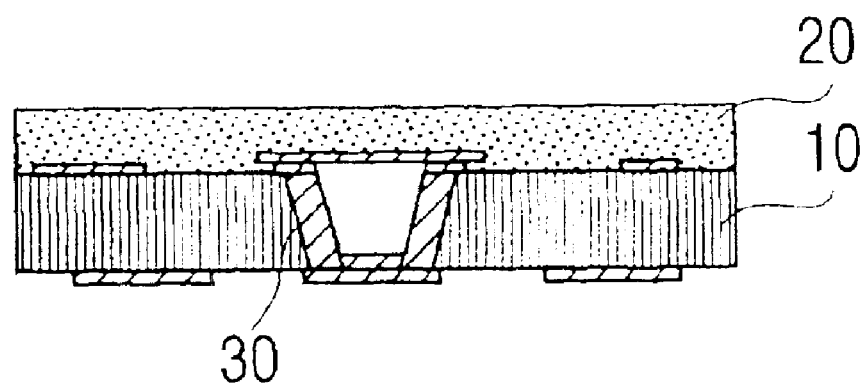
FIG. 8 illustrates a waveguide formed in a printed circuit board according to an example embodiment of the present invention.

FIG. 8 shows the FIG. 7 structure after bonding/lamination of the aligned components. That is, FIG. 8 shows the result of reflow of the bonding material (that formed the substrate 20) in the areas 82 and 84. Adhesion of the bonding material around the edges of waveguide capping surface (i.e., the top wall 36) ensures that the waveguide structure is maintained and that the two components are bonded/laminated together. One skilled in the art would understand that FIG. 8 may represent one layer (and bonding material) of a multi-layer printed circuit board or FIG. 8 may represent a plurality of layers of a printed circuit board. That is, FIG. 8 may not show the entire printed circuit board as other layers may also be formed and appropriately laminated together.

FIG. 9 illustrates a flowchart 100 showing operations of embodiments of the present invention. Other embodiments, operations and orders of operation are also within the scope of the present invention. More particularly, an initial substrate (such as a dielectric material) is obtained in block 102. A trench may be formed in the substrate in block 104. This may correspond to the structures shown in FIGS. 2 and 3. Subsequently, a metalized surface or metalized surfaces may be formed within the trench in block 106. This may correspond to the metalization of the sidewalls and bottom wall as shown in FIG. 4. In block 108, the metalized capping surface, which will be used to form the top wall of the waveguide structure, may be created. This may correspond to the operations shown in FIGS. 5A–5B or to the operations shown in FIGS. 6A–6C. In block 110, the metalized capping surface may be aligned over the initial substrate and the trench. This may correspond to the structure shown in FIG. 7. Subsequently, in block 112, the bonding material may be heated so as to affix the bonding material to the substrate. This may correspond to the structure shown in FIG. 8. Accordingly, the method shown in the flowchart 100 forms at least one waveguide within a substrate of a printed circuit board.

Accordingly, embodiments of the present invention may provide a method for forming a waveguide in a printed circuit board. This may include forming a trench in a substrate and forming at least one metalized surface along the trench. A metalized capping surface may be provided (or aligned) over the trench so as to form a waveguide structure.

In another embodiment, the walls of the waveguide may not be metal; but rather may be a material with a reflective surface to the waves being propagated.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:

forming a trench in a substrate;

forming at least one metal trace on a surface of the substrate adjacent the trench;

providing at least one metalized surface along said trench; and activating a bonding material having a metalized capping surface to bond said bonding material to said substrate such that said metalized capping surface is attached to said at least one metal trace and is located substantially only over said trench.

2. The method of claim 1, wherein said substrate comprises a printed circuit board.

3. The method of claim 1, wherein said substrate comprises a dielectric material.

4. The method of claim 3, wherein said trench is formed by selectively removing portions of said dielectric material.

5. The method of claim 1, wherein said at least one metalized surface comprises sidewall surfaces and a bottom surface of a waveguide structure.

6. The method of claim 1, wherein said metalized capping surface on said bonding material is formed by applying a metal coating on said bonding material and selectively removing portions of said metal coating such that said metalized capping surface remains on said bonding material substantially only in places to be located over said trench.

7. The method of claim 1, wherein said metalized capping surface on said bonding material is formed by selectively placing said metalized capping surface on said bonding material.

8. The method of claim 1, further comprising filling said trench with a material.

9. A method comprising:

forming a trench in a printed circuit board substrate, said trench having a first side surface, a second side surface and a bottom surface;

forming at least one surface on said first side surface, said second side surface and said bottom surface of said trench;

forming a capping surface on a bonding material; and forming said capping surface as a top surface aligned substantially only over said trench having said at least one surface, said top surface being different than said bonding material, wherein said forming said capping surface comprises leaving a space between said bonding material and said substrate.

10. The method of claim 9, wherein said at least one surface comprises at least one metalized surface and said top surface comprises a separate top metalized surface, wherein said capping surface is a metalized capping surface.

11. The method of claim 10, wherein said substrate comprises a dielectric material.

12. The method of claim 11, wherein said trench is formed by selectively removing portions of said printed circuit board substrate.

13. The method of claim 11, wherein said forming said top metalized surface over said trench comprises affixing said bonding material having said metalized capping surface to said printed circuit board substrate by reflowing said bonding material such that said metalized capping surface forms a cap aligned over said trench.

14. The method of claim 13, wherein said metalized capping surface on said bonding material is formed by applying a metal coating on said bonding material and selectively removing portions of said metal coating such that said metalized capping surface remains on said bonding material substantially only in areas to be located over said trench.

15. The method of claim 13, wherein said metalized capping surface on said bonding material is formed by providing said bonding material and selectively aligning said metalized capping surface on said bonding material.

16. The method of claim 9, further comprising filling said trench with a material.

17. A method comprising:

forming a trench in a printed circuit board;

forming at least one metal trace on a surface of the printed circuit board adjacent to the trench; and forming a waveguide structure in said trench of said printed circuit board by bonding a bonding material having a metalized capping surface to said printed circuit board such that said metalized capping surface is attached to the metal trace and is located substantially only over said trench to form said waveguide structure.

18. A method of claim 17, wherein the method further includes metalizing walls of said trench.

19. The method of claim 18, wherein said bonding said bonding material includes heating said bonding material to affix said bonding material to said printed circuit board.

20. The method of claim 17, further comprising filling said trench with a material.

21. A structure comprising:

a printed circuit board, and a waveguide structure provided within said printed circuit board, said waveguide structure including:

a trench within said printed circuit board;

at least one metal trace formed on a surface of the printed circuit board adjacent a top opening of the trench; and a bonding material having a capping surface on at least a portion of said bonding material, the bonding material disposed on top of said trench with said capping surface attached to said at least one metal trace and aligned substantially only over said trench.

22. The structure of claim 21, wherein said trench is within said printed circuit board between a top surface of said printed circuit board and a bottom surface of said printed circuit board.

23. The structure of claim 21, wherein said waveguide structure includes material for walls of said waveguide structure such that said walls have reflective surfaces to enable guiding signals through said waveguide structure.

24. The structure of claim 23, wherein said waveguide structure comprises at least one metalized surface on at least one of a first sidewall, a second sidewall and a bottom wall and said capping surface is a metalized capping surface.

25. The structure of claim 22, wherein said trench is filled with a material.

26. The structure of claim 21, wherein the bonding material comprises a material selected from a list consisting of an epoxy and an adhesive.

27. The method of claim 1, wherein the bonding material includes a material selected from a list consisting of an epoxy and an adhesive.

28. The method of claim 13, wherein said bonding material comprises a material selected from a list consisting of an epoxy and an adhesive.

29. The method of claim 17, wherein said bonding material comprises a material selected from a list consisting of an epoxy and an adhesive.

* * * * *